United States Patent [19]

Dobbert et al.

[11] 4,174,493
[45] Nov. 13, 1979

[54] VERTICAL DEFLECTION CIRCUIT

[75] Inventors: Gerd Dobbert, Deizisau; Klaus Reh, Albershausen, both of Fed. Rep. of Germany

[73] Assignee: International Standard Electric Corporation, New York, N.Y.

[21] Appl. No.: 888,047

[22] Filed: Mar. 17, 1978

[30] Foreign Application Priority Data

Mar. 18, 1977 [DE] Fed. Rep. of Germany ....... 2712052

[51] Int. Cl.$^2$ ...................... H01J 29/70; H01J 29/76
[52] U.S. Cl. ..................................... 315/408; 315/399
[58] Field of Search ........................ 315/408, 399, 410

[56] References Cited
U.S. PATENT DOCUMENTS 4,048,544  9/1977  Haferl ................................. 315/408

*Primary Examiner*—Theodore M. Blum

*Attorney, Agent, or Firm*—John T. O'Halloran; Peter C. Van Der Sluys

[57] ABSTRACT

The invention relates to a vertical deflection circuit used in television receivers. U.S. Pat. No. 4,048,544 proposes to derive the vertical deflection voltage by feeding the vertical deflection coil with decreasing portions of the horizontal retrace pulse during the first picture half, and with oppositely directed portions increasing from zero during the second picture half. That method involves very short pulse times and, thus, high voltages and currents to generate the desired deflection power. Therefore, fast thyristors with high blocking voltages must be used. According to the invention, the pulses are taken from the horizontal sweep. Thus, they can be longer and, consequently, smaller even at small currents, and complementary transistors can be used as switching means.

7 Claims, 2 Drawing Figures

VERTICAL DEFLECTION CIRCUIT

The present invention relates to a vertical deflection circuit wherein the deflection current for the deflection coils is obtained by integrating pulses derived from the horizontal deflection voltage by means of two switches associated with the upper and the lower picture half, respectively, and actuated by a control circuit in the rhythm of the horizontal frequency.

Such an arrangement is known from U.S. Pat. No. 4,048,544. There, the vertical deflection winding is fed decreasing portions of the energy of the horizontal deflection wave during the first picture half, and increasing portions during the second picture half, by completing a current path for the horizontal retrace pulses between the horizontal deflection circuit and the vertical deflection coils by means of the two switches, a capacitor in parallel with the vertical deflection coils integrating the pulses obtained by the actuation of the switches in such a manner that a sawtooth current is generated in the coils.

Since the horizontal retrace pulses have high voltage values, switches must be used which are sufficiently voltage-proof. The retrace interval is very short (about $4 \cdot 10^{-6}$s). Since pulses must be taken from this interval, their width can only be very small, so the switches must also be correspondingly fast. In addition, the currents flowing through the switches must be large enough to achieve the deflection power required with such narrow pulses.

As a consequence, only power thyristors with high blocking voltage can be used for the switches. There are no complementary types of the thyristors shown in FIG. 1 of U.S. Pat. No. 4,048,544, so only the arrangement of FIG. 3 of that application can be implemented. However, the realisation of a high blocking voltage inevitably involves a relatively high on-state voltage, i.e., high losses which must be dissipated as heat. The large currents also require corresponding wire thicknesses in the output windings needed to couple out the retrace pulses, and in all other inductive components.

Accordingly, the object of the present invention is to provide a modified circuit which uses lower voltages, wider pulses, and, consequently, smaller currents so that the switches can be well-proved medium-power transistors with collector-emitter cutoff voltages in the range from 45 to 60 V. This object is achieved by the means set forth in the claims. The advantages obtained by the invention are seen in a reduction in power dissipation and in the fact that low-priced components can be used, while all advantages of the circuit disclosed in U.S. Pat. No. 4,048,544 are preserved.

The vertical deflection circuit according to the invention will now be described in detail with the aid of the example shown in the accompanying drawing, in which.

Figure 1:
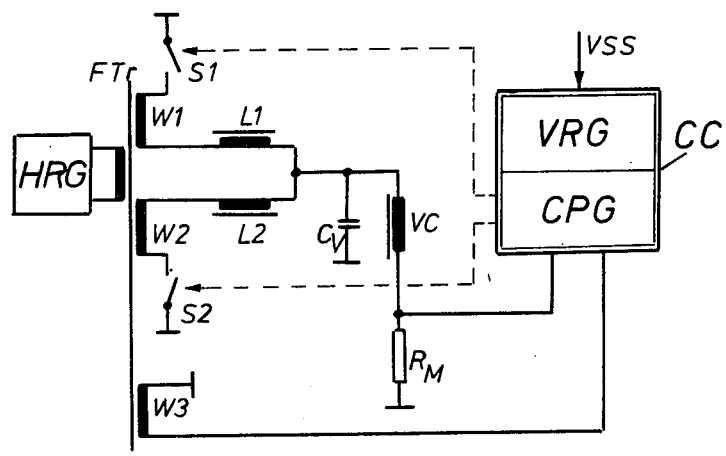
FIG. 1 is a schematic circuit diagram.
Figure 2:
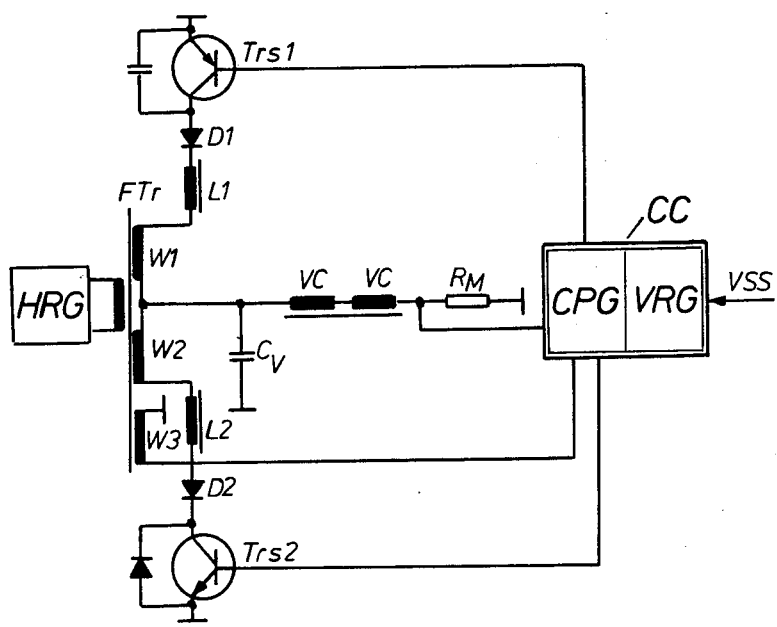
FIG. 2 shows an embodiment with transistors as switches.

In both figures, parts having corresponding functions are designated by like reference characters. VC are the vertical deflection coils, which are connected in series with a resistor $R_M$, across which drops a voltage proportional to the current flowing through the vertical deflection coils. Connected in parallel with this series arrangement is an integrating capacitor $C_V$ which, when one of the two switches S1, S2 is actuated, is charged positively or negatively, respectively, from the horizontal sweep, the charging current flowing through inductors L1 and L2, respectively, which, together with the output windings W1 and W2 on the horizontal-output transformer FTr, offer the necessary integration resistance. It makes no difference whether these inductors L1 and L2 are connected between the integrating capacitor $C_V$ and the associated ends of the output windings W1 and W2, respectively, as shown in FIG. 1, or between the switches S1 and S2, respectively, and the other ends of the output windings, as shown in FIG. 2. The switches are controlled, in known manner, by a control circuit CC, which closes the first switch S1 for increasingly shorter periods during the first half of a picture, and the switch S2 for increasingly longer periods during the second picture half. The control circuit CC contains the vertical sawtooth generator VRG, which is synchronized by vertical syc signals VSS, and the control-signal generator CPG, which is fed with the vertical sawtooth signal, the horizontal sawtooth signal, and the voltage taken from the resistor RM. One of its two outputs provides the control signals for the switch S1, and the other those for the switch S2. A required control pulse can be taken from an output winding W3 of the horizontal-output transformer FTr, which is supplied from the horizontal sawtooth generator HRG.

In the arrangement disclosed in the above-mentioned U.S. Pat. No. 4,048,544, the two switches S1 and S2 take the charging pulses for the integrating capacitor $C_V$ from the horizontal retrace, i.e. in a period corresponding to approximately 6% of the line period and, thus, to a time of $1 \cdot 6/15625 \cdot 100 \approx 4 \cdot 10^{-6}$s. Since these charging pulses are to vary in width in order to give a sawtooth shape after integration, their width must decrease as the amplitude of the sawtooth signal decreases. However, since the energy necessary for vertical deflection is to be obtained from these pulses, correspondingly high voltages must be coupled out, and correspondingly high peak currents must flow. As a result, only power thyristors with high blocking voltages can be used for the switches, which presents certain difficulties in driving the thyristors since there are no complementary types thereof. To this must be added that, like in all semiconductors, a high blocking voltage entails a higher on-state voltage. This causes relatively high losses of energy as heat which must be removed. In television engineering it has been common practice from the outset to derive the high voltage needed for the picture tube from the horizontal retrace, the high voltage and beam currents in modern-day colour-picture tubes having become larger. Any withdrawal of substantial portions of the retrace energy for other purposes automatically increases the sweep energy requirement.

According to the present invention, it is therefore proposed to turn on the two switches S1 and S2 during the horizontal sweep time only. Since the horizontal sweep time is about 15 times as long as the retrace time, the "on" period of the switch can be 15 times as long, too, if the same control action is taken. Accordingly, voltages and currents can be correspondingly smaller. The removed energy must now be additionally generated for the horizontal sweep, but this increases the retrace energy, whereby more energy is available for the high-voltage generation. This is of great importance particularly if the horizontal deflection signals are generated not with thyristor circuits but with transistor circuits. Now, switching voltages and currents can be chosen so that the switches can be formed by medium-power transistors having the usual collector-emitter cutoff voltages of only about 40–50 volts and, consequently, on-state voltages of less than 0.5 V. It is necessary, however, to use a diode to provide protection against any cutoff voltages of opposite direction occurring during the horizontal retrace.

Such a circuit is shown in FIG. 2. Trs1 and Trs2 are the two switches S1 and S2, and D1 and D2 are the two protective diodes against the retrace voltages. To provide protection against any cutoff voltages of opposite direction resulting from leakage currents or diode capacitances, the transistors Trs1 and Trs2 may be by-passed by protective capacitors or protective diodes. A protective capacitor is shown at Trs1, and a protective diode at Trs2. Since complementary types of the transistors required are available at reasonable cost, the emitters of the transistors Trs1 and Trs2 can be grounded, thus eliminating the need for any special drive circuitry. Since all these measures keep circuit losses low, it is possible to combine the control circuit CC, consisting of the vertical sawtooth generator VRG and the subsequent control-signal generator CPG, and the switching transistors Trs1 and Trs2 in a single monolithic circuit, which simplifies the circuit design and provides a saving in cost.

What is claimed is:

1. In a vertical deflection circuit, of the type wherein the deflection current for the vertical deflection coils is obtained by integrating pulses derived from the horizontal deflection voltage, a horizontal output transformer including a pair of output windings each connected to an integrating capacitor and the vertical deflection coils at one end and the other ends being selectively connected to ground through two switches associated with the upper and lower picture halves, the improvement comprising control means for turning on said switches only during the horizontal sweep time in the rhythm of the horizontal frequency with only one of the other ends of the two output windings being grounded at one time.

2. A vertical deflection circuit as described in claim 1, wherein the switches are two complementary transistors.

3. A vertical deflection circuit as recited in claim 2, wherein the transistors are protected from the retrace pulses by means of series connected diodes which are reverse connected with respect to the retrace pulses.

4. A vertical deflection circuit as recited in claim 2, wherein each of the transistors has an emitter that is grounded.

5. A vertical deflection circuit as recited in claim 3, wherein each of the transistors has an emitter that is grounded.

6. A vertical deflection circuit as recited in claim 4 wherein the control means and the transistors are formed as a monolithic circuit.

7. A vertical deflection circuit as recited in claim 5, wherein the control means and the transistors are formed as a monolithic circuit.

* * * * *